(12) United States Patent
Yoda et al.

(10) Patent No.: US 8,796,823 B2
(45) Date of Patent: Aug. 5, 2014

(54) SEMICONDUCTOR DEVICE HAVING THROUGH ELECTRODES, A MANUFACTURING METHOD THEREOF, AND AN ELECTRONIC APPARATUS

(71) Applicant: Seiko Epson Corporation, Tokyo (JP)

(72) Inventors: Tsuyoshi Yoda, Matsumoto (JP); Kazumi Hara, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/675,561

(22) Filed: Nov. 13, 2012

(65) Prior Publication Data

US 2013/0075896 A1  Mar. 28, 2013

Related U.S. Application Data

(63) Continuation of application No. 12/619,753, filed on Nov. 17, 2009, now Pat. No. 8,330,256.

(30) Foreign Application Priority Data

Nov. 18, 2008 (JP) .................................. 2008-294772

(51) Int. Cl.
*H01L 29/40* (2006.01)

(52) U.S. Cl.
USPC ........... 257/621; 257/774; 257/783; 257/778; 257/776; 438/108; 438/629; 438/639; 438/667; 438/672

(58) Field of Classification Search
USPC ......... 257/774, 777, 778, 737, 738, 734, 621, 257/618, 622, 773, 776, 786, 723, 686, 635, 257/637, 782, 783; 438/637, 638, 639, 640, 438/668, 618, 612, 613, 614, 675, 652, 597, 438/622, 629, 672, 679, 667, 118, 108, 109, 438/666, 700, 701, 713

See application file for complete search history.

(56) References Cited

U.S. PATENT DOCUMENTS

| | | | |
|---|---|---|---|
| 6,664,129 B2 * | 12/2003 | Siniaguine | 438/107 |
| 7,138,710 B2 * | 11/2006 | Fukazawa | 257/686 |
| 7,279,776 B2 | 10/2007 | Morimoto | |
| 7,484,293 B2 | 2/2009 | Yamaji et al. | |
| 8,330,256 B2 * | 12/2012 | Yoda et al. | 257/621 |
| 2003/0173678 A1 | 9/2003 | Mizukoshi | |
| 2004/0188822 A1 * | 9/2004 | Hara | 257/689 |
| 2004/0245623 A1 * | 12/2004 | Hara et al. | 257/698 |
| 2005/0151228 A1 * | 7/2005 | Tanida et al. | 257/620 |
| 2006/0009009 A1 * | 1/2006 | Hara | 438/464 |
| 2009/0047755 A1 | 2/2009 | Yamaji et al. | |
| 2009/0095511 A1 * | 4/2009 | Iida et al. | 174/255 |
| 2010/0159193 A1 | 6/2010 | Young et al. | |

FOREIGN PATENT DOCUMENTS

| | | |
|---|---|---|
| JP | 2001-053218 | 2/2001 |
| JP | 2003-273155 | 9/2003 |
| JP | 2004-297019 | 10/2004 |
| JP | 2005-347460 | 12/2005 |
| JP | 2007-180384 | 7/2007 |

* cited by examiner

*Primary Examiner* — Thanh Y Tran
(74) *Attorney, Agent, or Firm* — Harness, Dickey & Pierce, P.L.C.

(57) ABSTRACT

A semiconductor device includes a semiconductor substrate and a through electrode provided in a through hole formed in the semiconductor substrate. The through electrode partially protrudes from a back surface of the semiconductor substrate, which is opposite to an active surface thereof. The through electrode includes a resin core and a conductive film covering at least a part of the resin core.

14 Claims, 10 Drawing Sheets

FIG.11

SEMICONDUCTOR DEVICE HAVING THROUGH ELECTRODES, A MANUFACTURING METHOD THEREOF, AND AN ELECTRONIC APPARATUS

CROSS-REFERENCE TO RELATED APPLICATIONS

This is a continuation application of U.S. application Ser. No. 12/619,753 filed Nov. 17, 2009 which claims priority to Japanese Patent Application No. 2008-294772 filed on Nov. 18, 2008, all of which are hereby expressly incorporated herein by reference in their entireties.

BACKGROUND

1. Technical Field

The present invention relates to a semiconductor device, a manufacturing method thereof, and an electronic apparatus.

2. Related Art

For multilayer semiconductor devices, accurate positioning has been required to bond bumps. For this reason, bonding has been performed by applying heat and pressure using a flip chip bonder. However, there has been a problem that when using solder to bond bumps, the solder overflows from the bonding portions due to the application of heat and pressure and thus a bonding failure easily occurs.

In the configuration described in JP-A-2001-53218, an insulating film is formed on side surfaces of back surface terminals protruding from a silicon substrate. For this reason, at the time of bonding, excessive solder may extend to the vicinities of the terminals thereby becoming shorted to the silicon substrate. Also, there has been a problem that even if a non-weighting bonding method, such as reflow bonding, is used, the bonding strength decreases if the tips of back surface terminals are flat surfaces as in JP-A-2001-53218.

In order to solve this problem, there has been a proposed configuration where Cu of side surfaces of back surface terminals is exposed and a base portion on a silicon substrate is covered by an insulating film, as shown in JP-A-2004-297019. The Cu-exposed portions on the side surfaces of the terminals contribute to solder bonding. The formed solder takes a shape having a skirt extending from the vicinities of the back surface terminals to terminals on an active surface of the semiconductor substrate (silicon substrate). Thus, a short between overflow solder and the semiconductor substrate or a short between the terminals can be avoided. Since the bonding area is increased, the bonding strength is also increased.

However, even if the method described in JP-A-2004-297019 is used, the solder amount is difficult to control. Therefore, it is difficult to avoid a bonding failure completely. Also, the pitch has been narrowed to meet the downsizing demand. However, there remains a problem that the related-art structure uses solder bonding and therefore the pitch is difficult to narrow.

SUMMARY

An advantage of the invention is to provide a semiconductor device that includes favorably bonded terminals thereby increasing reliability and can easily correspond to terminals disposed at narrower pitches, a manufacturing method of the semiconductor device, and an electronic apparatus.

A semiconductor device according to a first aspect of the invention includes a semiconductor substrate and a through electrode provided in a through hole formed in the semiconductor substrate. The through electrode partially protrudes from a back surface of the semiconductor substrate, which is opposite to an active surface thereof. The through electrode includes a resin core and a conductive film covering at least a part of the resin core.

In the first aspect of the invention, the through electrode partially protrudes from the back surface. When an electronic element is mounted on the semiconductor substrate, the through electrode is brought into contact with the electronic element using deformation of the resin core provided inside the conductive film included in the through electrode. For this reason, the contact area of the through electrode with a terminal of the electronic element is increased. Thus, connection reliability is increased. Also, due to elastic deformation of the resin core, the bonding strength between the through electrode and terminal is increased. Also, pressure bonding can be performed using only the resin.

The semiconductor device according to the first aspect of the invention can avoid a short between overflow solder and the semiconductor substrate or a short between terminals, which has been a problem with respect to bonding using a low-melting-point metal, such as solder. For this reason, the connection reliability is higher than that of the related-art examples.

A tip of a protruding portion of the through electrode preferably takes the shape of a curved surface, which is convex outwardly.

By adopting the first aspect of the invention, when bonding the through electrode to the terminal of the electronic element, the through electrode becomes deformed easily.

The protruding portion of the through electrode preferably takes a tapered shape, which is tapered toward a tip.

By adopting the first aspect of the invention, the contact area of the through electrode with the terminal of the electronic element is further increased. Thus, connection reliability is further increased.

The conductive film preferably includes at least one ductile metallic film.

If the conductive film includes at least one ductile metallic film by adopting the first aspect of the invention, the conductive film becomes deformed easily together with the resin core.

A side surface of a base portion of a protruding portion of the through electrode is preferably covered by a base layer that is provided in the through hole and partially protrudes from the back surface of the substrate.

By adopting the first aspect of the invention, a short between the deformed through electrode and semiconductor substrate can be avoided.

The through hole is preferably long in one direction in a plan view. The through electrode preferably includes the resin core extending along the through hole and the conductive film that is formed on a surface of the resin core and includes a plurality of conductive films.

By adopting the first aspect of the invention, the multiple through electrodes are provided in the opening of the one through hole. This can make the pitch narrower thereby downsizing the device.

An electrode terminal electrically connected to the conductive film is preferably formed on the active surface of the semiconductor substrate.

By adopting the first aspect of the invention, the tip of the through electrode protruding from the back surface can function as a terminal to be connected to the terminal of the electronic element.

A semiconductor device manufacturing method according to a second aspect of the invention includes: (a) forming a via from an active surface of a semiconductor substrate; (b) forming a base layer on an inner surface of the via; (c) forming a conductive film on the base layer; (d) filling the via with a resin; (e) thinning down the semiconductor substrate so that the via passes through the semiconductor substrate; and (f) exposing the conductive film by eliminating the base layer protruding from a back surface opposite to the active surface.

By adopting the second aspect of the invention, a semiconductor device having a structure where a resin core bump protrudes from the back surface of the semiconductor substrate can be obtained. Thus, a short between overflow solder and the semiconductor substrate or a short between terminals, which has been a problem with respect to bonding using a low-melting-point metal, such as solder, can be avoided. Thus, a semiconductor device having high connection reliability can be obtained.

Also, the step of forming a resin core bump and the step of forming a through electrode are combined, so the cost can be significantly reduced.

In step (a), a bottom surface of the via is preferably formed in the shape of a curved surface.

By adopting the second aspect of the invention, the tip of the through electrode is formed in the shape of a curbed surface. Thus, the tip becomes a terminal that becomes deformed easily when bonding and can reliably obtain bonding strength.

In step (a), the via is preferably formed in a tapered shape.

By adopting the second aspect of the invention, a through electrode that can further increase the contact area thereof with a terminal of an electronic element can be formed. Thus, connection reliability is further increased.

In step (f), the base layer is preferably partially left on a base portion of a protruding portion of the through electrode.

By adopting the second aspect of the invention, when bonding the semiconductor substrate and electronic element together, a short between the deformed through electrode (conductive film) and semiconductor substrate can be avoided.

The semiconductor device manufacturing method according to the second aspect of the invention preferably further includes (g) patterning the conductive film into a plurality of areas after step (c). In step (a), the via is preferably formed in such a manner that the via is long in one direction in a plan view.

By adopting the second aspect of the invention, the multiple through electrodes are formed in the one through hole. This can make the pitch between terminals narrower thereby downsizing the device.

The semiconductor device manufacturing method according to the second aspect of the invention further includes (h) forming on the active surface of the semiconductor substrate an electrode terminal electrically connected to the conductive film.

By adopting the second aspect of the invention, the front surface and back surface of the semiconductor substrate are electrically connected to each other at the same time that the resin core bump is formed. Thus, the manufacturing process can be reduced.

An electronic apparatus according to a third aspect of the invention includes the semiconductor device according to the first aspect of the invention.

By adopting the third aspect of the invention, an electronic apparatus having increased connection reliability can be obtained.

BRIEF DESCRIPTION OF THE DRAWINGS

The invention will be described with reference to the accompanying drawings, wherein like reference numerals represent like elements.

DESCRIPTION OF EXEMPLARY EMBODIMENTS

Now, embodiments of the invention will be described with reference to the accompanying drawings. In order to make the members of the embodiments recognizable in the drawings, each member is scaled up or down as appropriate.

First Embodiment

Hereafter, a semiconductor device and a manufacturing method thereof according to a first embodiment of the invention will be described.

Semiconductor Device

Figure 1:
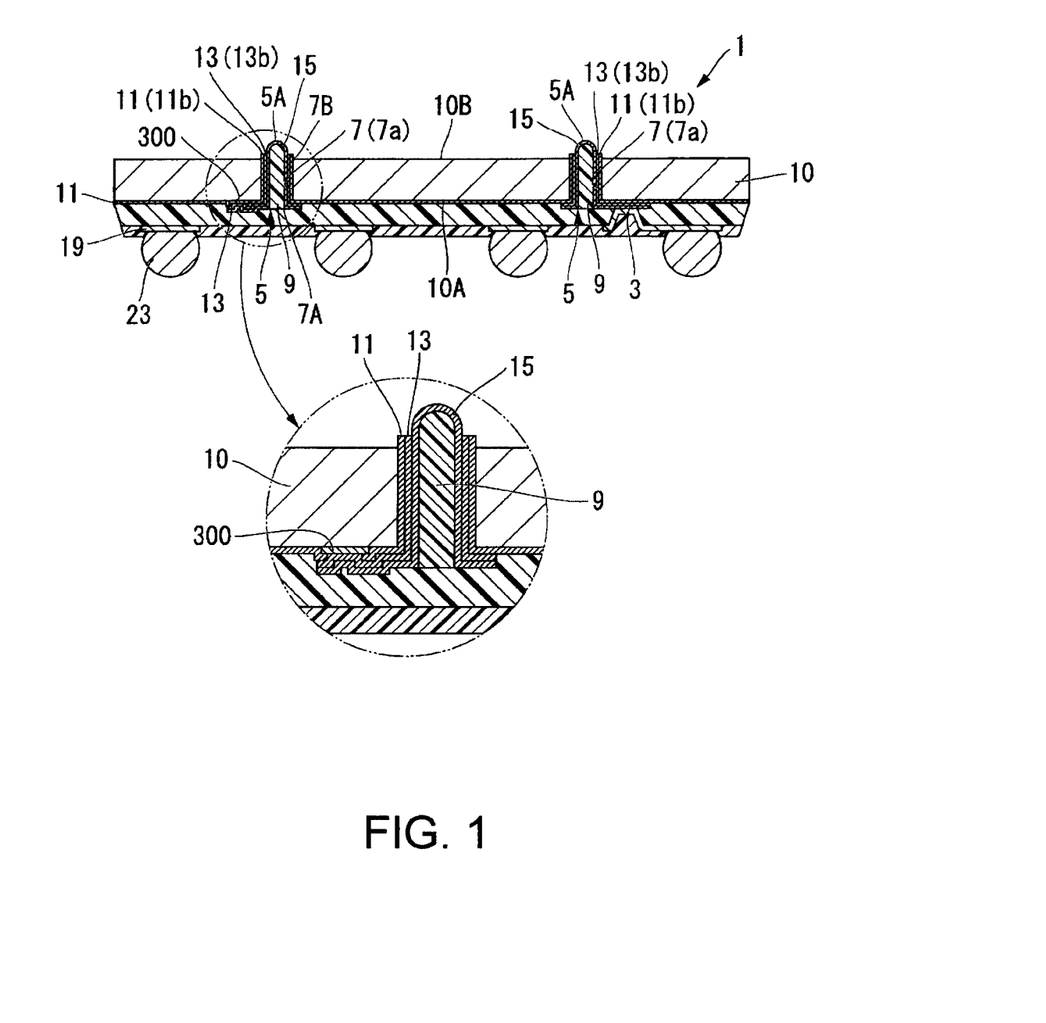
FIG. 1 is a sectional view showing a schematic configuration of a semiconductor device according to a first embodiment of the invention.

FIG. 1 is a sectional view showing a schematic configuration of a semiconductor device 1 according to this embodiment.

As shown in FIG. 1, the semiconductor device 1 includes a semiconductor substrate 10 obtained by forming an integrated circuit (not shown) including a transistor, a memory element, and other electronic elements, and the like on one surface of a silicon base material, which is obtained by cutting a silicon wafer, using a known method. Hereafter, a surface having the integrated circuit and the like formed thereon, of the semiconductor substrate 10 will be referred to as an "active surface 10A" and a surface opposite to the active surface 10A will be referred to as a "back surface 10B." The semiconductor substrate 10 is made of, for example, a rectangular silicon substrate. Instead, for example, a ceramic substrate or a resin substrate may be used.

Also, the semiconductor device 1 according to this embodiment includes multiple through electrodes 5 passing through the active surface 10A and back surface 10B of the semiconductor substrate 10, multiple electrode pads 300

(electrode terminals) provided on the active surface 10A, and multiple bump electrodes 5A provided on the back surface 10B.

The electrode pads 300 are made of, for example, Al. The electrode pads 300 may be, for example, electrode pads each formed by laminating multiple metallic films, and the material thereof may be changed as appropriate in accordance with the electrical characteristics or the like required by the electrode pads 300. The electrode pads 300 are connected to the integrated circuit formed on the active surface 10A. In addition, electrode pads 3 for re-disposition wiring lines are formed on the active surface 10A.

The through electrodes 5 are disposed in through holes 7 passing through the semiconductor substrate 10 in the substrate thickness direction. Each through electrode 5 includes a resin core 9 disposed in the through hole 7 and a conductive film 15 covering a surface of the resin core 9. A part of each through electrode 5 protrudes from an opening 7B on the back surface 10B, of the through hole 7. The protruding portions serve as bump electrodes 5A to be electrically bonded to terminals 61 (FIG. 6O) of an electronic element 60 to be described later. The bump electrodes 5A according to this embodiment are so-called "resin core bumps" using, as the core, the conductive film 15 and the resin core 9 provided inside the conductive film 15.

The through holes 7 according to this embodiment each take a cylindrical shape. A base layer 11, a metallic layer 13, and the conductive film 15 are disposed on an inner surface 7a of each through hole 7 in the order presented. The resin core 9 is embedded in the center of the through hole 7.

The base layer 11 is made of $SiO_2$ (silicon oxide), but not limited thereto. A nitride film or a resin material, such or an epoxy, may be used. The base layer 11 is provided to prevent a current leak between each metallic layer 13 and semiconductor substrate 10 and erosion or the like of the semiconductor substrate 10 due to oxygen, water, or the like. The base layer 11 is formed as covering not only the inner surfaces of the through holes 7 but also almost the entire active surface 10A except for portions of the electrode pads 300.

The metallic layers 13 are made of a metallic material, such as TiW (titanium tungsten), and have a function of ensuring the adhesion between the conductive films 15 and base layer 11 so as to bond both the layers together favorably. Each metallic layer 13 is formed as covering not only the inner surface 7a of the through hole 7 but also a part of the base layer 11 near the through hole 7 on the active surface 10A, and also extends onto a layer below the electrode pad 3.

An end 11b of the base layer 11 and an end 13b of the metallic layer 13 extend from each through hole 7 in such a manner that these ends protrude from the back surface 10B to a midpoint of the protrusion length of the bump electrode 5A, as shown in FIG. 1. In other words, both the ends cover the side surface of the base portion of the bump electrode 5A near the back surface 10B.

The conductive films 15 are each a single layer of a ductile metallic film made of Au, TiW, Cu, Cr, Ni, Ti, W, NiV, Al, Pd, lead-free solder, or the like, or a lamination of layers made of some among these metals. The conductive films 15 become deformed elastically together with the resin cores 9 when bonded to the terminals of the electronic element to be described later, so Au having particularly good ductility is preferably used.

Each conductive film 15 is electrically connected to the electrode pad 3 that is formed on the active surface 10A as covering the metallic layer 13.

Each resin core 9 is disposed in the center of the through hole 7 as embedded in the through hole 7 and is made of a photosensitive insulating resin, a thermosetting insulating resin, or the like, such as a polyimide resin, an acrylic resin, a phenolic resin, a silicone resin, a silicone-modified polyimide resin, or an epoxy resin. The material (hardness) and shape of the resin cores 9 are selected or designed as appropriate in accordance with the shape of the bump electrodes 5A, or the like.

In the semiconductor device 1 according to this embodiment, the tip of each bump electrode 5A takes a hemispheric shape. Thus, when the electronic element is mounted, each bump electrode 5A becomes deformed so that each bump electrode 5A is electrically and favorably connected to the corresponding electrode terminal on the electronic element.

Semiconductor Device Manufacturing Method

Figure 2:
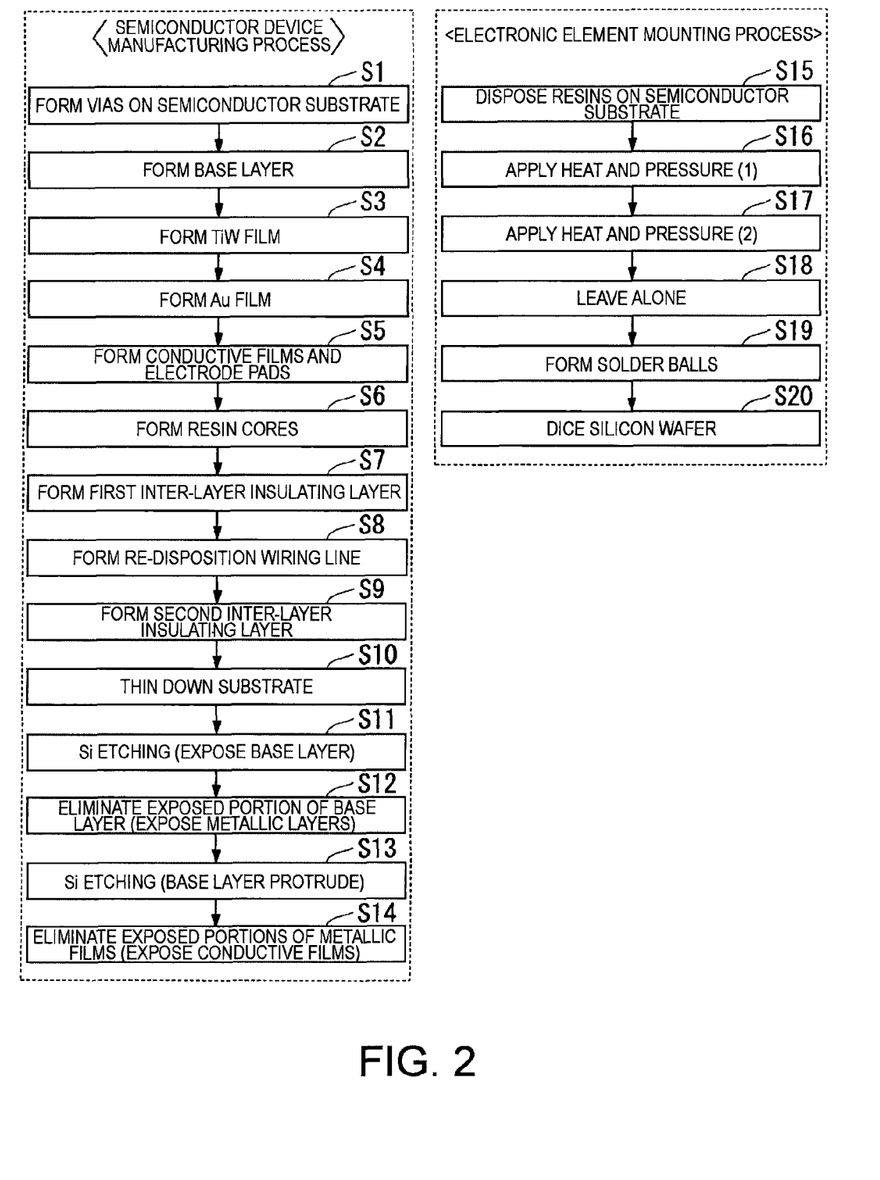
FIG. 2 is a flowchart showing a method for manufacturing the semiconductor device according to the first embodiment.

Next, a method for manufacturing the semiconductor device 1 will be described with reference to FIGS. 2 to 7. FIG. 2 is a flowchart showing a method for manufacturing the semiconductor device 1. FIGS. 3A to 7 are drawings showing steps of the method for manufacturing the semiconductor device 1. In this embodiment, a manufacturing method in which the multiple semiconductor devices 1 are formed on a silicon wafer 100 simultaneously and collectively using the W-CSP (wafer level chip scale package) technology, re-disposition wiring lines are formed, and then the collective semiconductor devices 1 are diced into individual semiconductor devices 1 will be described.

FIGS. 3A to 7 showing the midway steps for manufacturing the semiconductor devices 1 are simplified drawings and show one semiconductor device 1 formed on the silicon wafer 100. It is assumed that the silicon wafer 100 and semiconductor substrate 10 to be used to describe the manufacturing process are identical to each other.

Figure 3A:
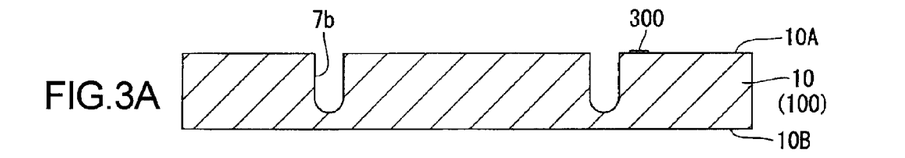
FIGS. 3A to 3G are sectional views showing steps of the method for manufacturing the semiconductor device according to the first embodiment.

First, as shown in FIG. 3A, vias 7b are made on the active surface 10A of the semiconductor substrate 10 on which the integrated circuit is formed (S1). In this embodiment, the vias 7b having a diameter of 50 μm and a depth of 100 μm are made in predetermined positions of a silicon base material having a thickness of 625 μm using dry etching. In this case, adjustment is made so that the bottom surfaces of the vias 7b are curved. As for etching, a $SiO_2$ film may be used as a photoresist mask or a hard mask. Also, both a photoresist mask and a hard mask may be used. The etching method is not limited to dry etching. Wet etching or laser treatment or both may be used.

Figure 3B:
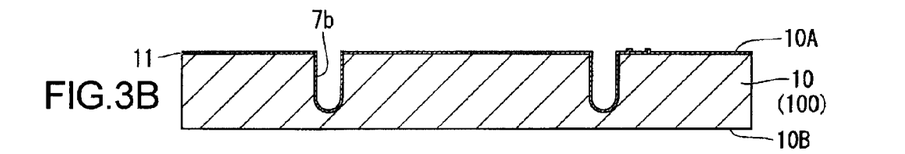

Next, as shown in FIG. 3B, the base layer 11 is formed as covering the active surface 10A of the semiconductor substrate 10 and the inner surfaces of the vias 7b (S2). In this case, a $SiO_2$ film is formed with a thickness of 3000 Å or more using CVD. While $SiO_2$ is used in this embodiment, tetra ethyl ortho silicate ($Si(OC_2H_5)_4$; hereafter referred to as "TEOS") formed using PECVD (plasma enhanced chemical vapor deposition), that is, PE-TEOS and TEOS ($O_3$-TEOS) formed using ozone CVD may be used.

Figure 3C:
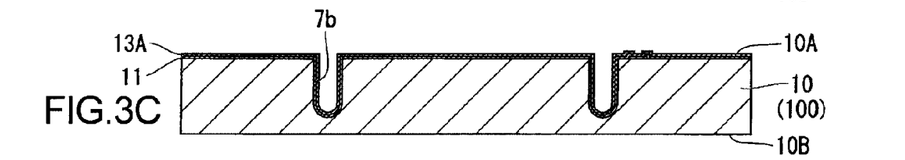

Next, as shown in FIG. 3C, a TiW film 13A is formed on the base layer 11 (S3). In this case, the TiW film 13A is formed with a thickness of 1000 Å on the active surface 10A of the semiconductor substrate 10 and inside the vias 7b using sputtering.

Figure 3D:
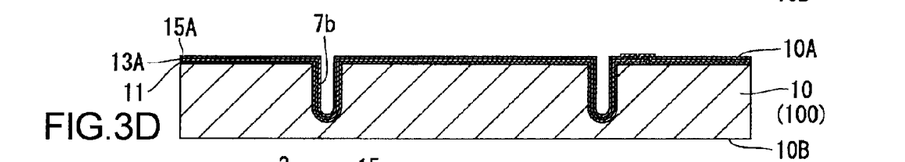

Next, as shown in FIG. 3D, an Au film 15A is formed on the metallic layer 13 (S4). In this case, the Au film 15A is formed with a thickness of 5000 Å on the active surface 10A of the semiconductor substrate 10 and inside the vias 7b using sputtering.

Figure 3E:
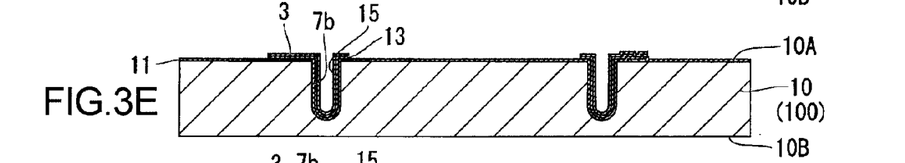

Subsequently, as shown in FIG. 3E, the Au film 15A and TiW film 13A are simultaneously patterned using known photolithography and etching. At that time, portions of the Au film 15A and TiW film 13A near the vias 7b on the active surface 10A are left, while the other portions thereof are eliminated. Thus, the conductive films 15 covering the inner surfaces of the vias 7b and the electrode pads 3 electrically connected to the conductive films 15 near the vias 7b on the active surface 10A are formed (S5). Also, the metallic layers 13 are formed below the conductive films 15 and electrode pads 3 in the same shape as those of these films.

Since the Au-sputtered film is formed on the TiW-sputtered film as adhering thereto, the adhesion between the base layer 11 and conductive film 15 or electrode pad 3 is ensured by each metallic layer 13. If necessary, the resistance value may be lowered using Au plating or the like. Also, in order to ensure the adhesion with a resin material for filling the vias 7b in a later step, another metallic layer may be formed.

Figure 3F:
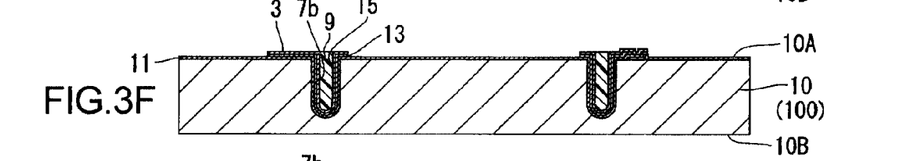

Next, as shown in FIG. 3F, the vias 7b become filled with the resin material so that the resin cores 9 are formed (S6). In this case, polyimide is used. In this embodiment, the bottom surfaces of the vias 7b are curved, so the vias 7b become filled while preventing entry of bubbles or the like into the resin.

Figure 3G:
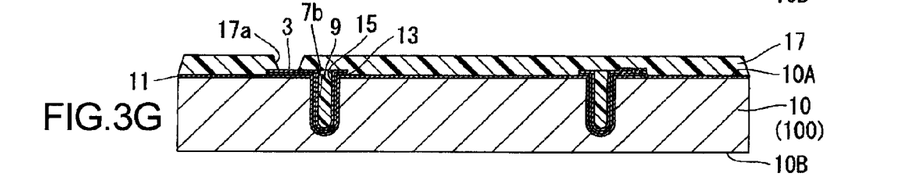

Next, as shown in FIG. 3G, a first inter-layer insulating layer 17 thicker than the electrode pads 3 is formed on the active surface 10A of the semiconductor substrate 10 (S7). In this case, a photosensitive resin layer, such as an epoxy resin or a polyimide resin, is applied to the active surface 10A and then exposed and developed so that an opening 17a for exposing a part of each electrode pad 3 is made on the photosensitive resin layer. The opening 17a may be formed using dry etching or the like. In this way, the first inter-layer insulating layer 17 is formed on the active surface 10A.

Figure 4H:
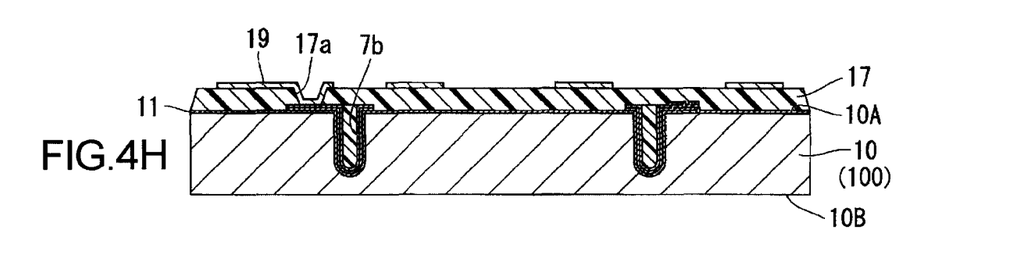
FIGS. 4H to 4J are sectional views showing steps of the method for manufacturing the semiconductor device according to the first embodiment.

Next, as shown in FIG. 4H, a re-disposition wiring line 19 is formed on the first inter-layer insulating layer 17 as connected to the electrode pad 3 via the opening 17a (S8). The re-disposition wiring line 19 is made of a material including at least one of Cu, Cr, Ti, Ni, TiW, Au, Ag, Al, NiV, W, TiN, and Pd and is formed using, for example, sputtering. Also, a wiring layer may be formed by laminating at least two of these materials.

Figure 4I:
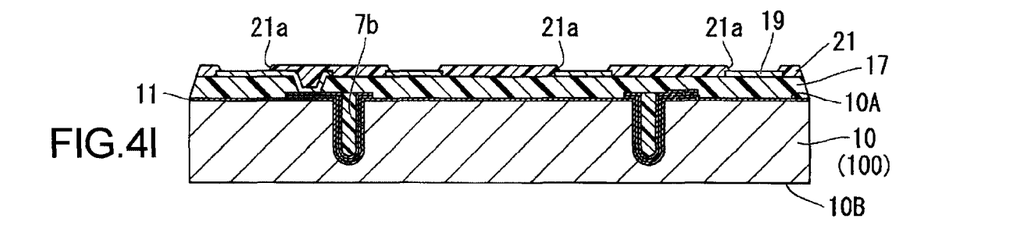

Next, as shown in FIG. 4I, a second inter-layer insulating layer 21 is formed on the first inter-layer insulating layer 17 (S9). The material of the second inter-layer insulating layer 21 may be the same as that of the first inter-layer insulating layer 17. First, a photosensitive resin is applied to an entire surface of the first inter-layer insulating layer 17. Subsequently, the photosensitive resin layer is exposed and developed so that an opening 21a for exposing a part of the re-disposition wiring line is formed on the photosensitive resin layer.

Figure 4J:
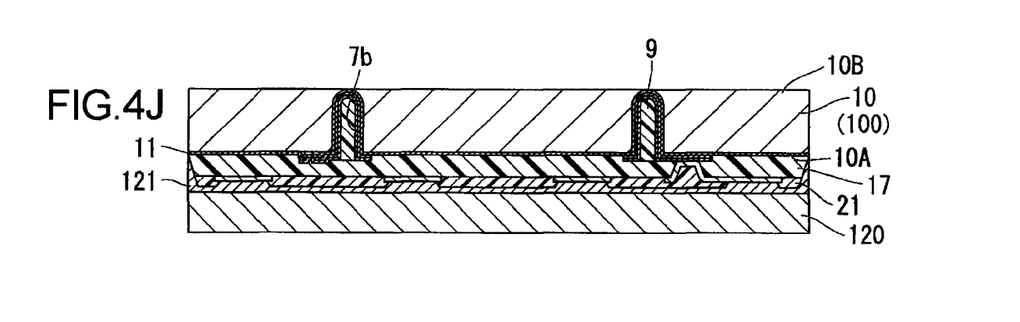

Next, as shown in FIG. 4J, the semiconductor substrate 10 is thinned down from the back surface 10B (S10).

First, the active surface 10A of the semiconductor substrate 10 having the electrode pads 3 formed thereon is supported by a supporting member 120 that is disposed with an adhesive 121 between the supporting member 120 and active surface 10A and is made of a glass substrate or the like. Subsequently, the semiconductor substrate 10 is polished down to a predetermined thickness by performing, for example, CMP (chemical mechanical polishing) on the back surface 10B of the semiconductor substrate 10 in a state where the semiconductor substrate 10 is bonded to the supporting member 120. Specifically, the treatment is performed until immediately before the base layer 11 is exposed. By reinforcing the semiconductor substrate 10 using the supporting member 120, warpage on the semiconductor substrate 10 is corrected and occurrence of a crack during treatment or handling is prevented.

Figure 5K:
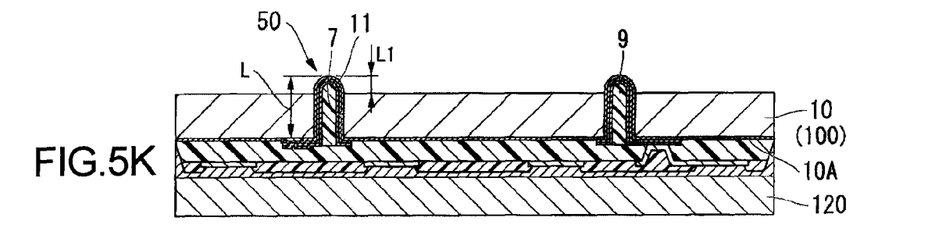
FIGS. 5K to 5N are sectional views showing steps of the method for manufacturing the semiconductor device according to the first embodiment.

Next, as shown in FIG. 5K, the thickness of the semiconductor substrate 10 is selectively reduced using dry etching, wet etching, or the like so that the vias 7b pass through the semiconductor substrate 10 as the through holes 7 and that portions 50 to serve as the through electrodes 5 later protrude from the back surface 10B of the semiconductor substrate 10 with a predetermined protruding amount (S11). It is preferable to use an etching method by which the base layer 11 is etched sufficiently more slowly than silicon. If dry etching is used, inductive coupling plasma etching (ICP) or the like can be used. If wet etching is used, the above-mentioned portions S50 can protrude by using HF, HNO3, a mixed liquor thereof, KOH or the like as an etchant. The protruding amount L1 of each portion 50 is set to 2 to 20% or so of the post length L.

Figure 5L:
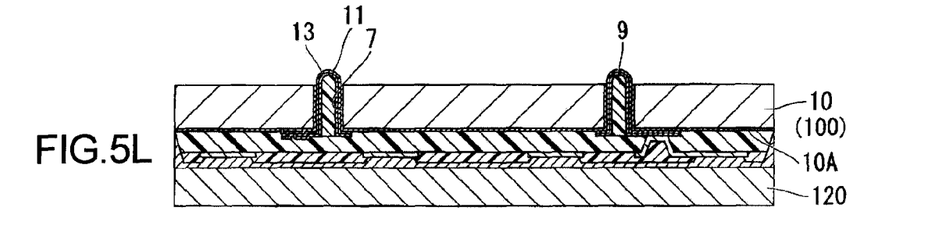

Next, as shown in FIG. 5L, exposed portions of the base layer 11 are eliminated so that the metallic layers 13 below the base layer 11 are partially exposed (S12). The base layer 11 is eliminated using dry etching, wet etching, or the like. If dry etching is used, reactive ion etching (RIE) can be used. In this case, $CF_4$, $O_2$, or the like is used as a gas. If wet etching is used, an etchant that can eliminate the base layer 11 without affecting the TiW layer must be selected. If the base layer 11 is made of $SiO_2$, diluted hydrofluoric acid is used.

Also, when causing the portions 50 to protrude from the silicon base material in the previous step, the base layer 11 may be eliminated using wet etching until the metallic layers 13 are exposed. In this case, it is possible to perform both the elimination of the base layer 11 and the exposure of the metallic layers 13 in one step.

Figure 5M:
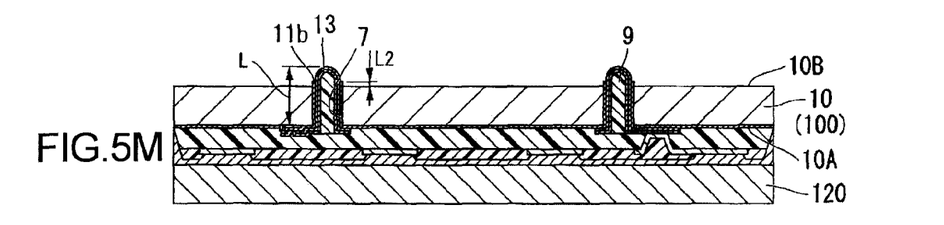

Next, as shown in FIG. 5M, the semiconductor substrate 10 is selectively thinned down by performing silicon etching again. Thus, the ends 11b of the base layer 11 protrude with a predetermined protruding amount (S13). If dry etching is used, ICP-RIE (inductive coupled plasma-reactive ion etching) is used. In this case, the protruding amount L2 of the base layer 11 is set to 2 to 20% or so of the post length L.

Figure 5N:
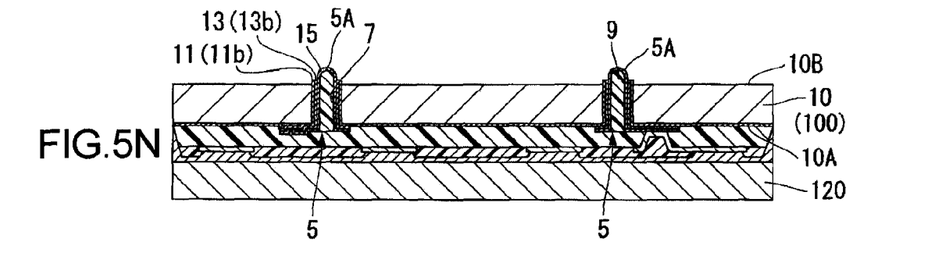

Next, as shown in FIG. 5N, exposed portions of the metallic layers 13 are eliminated so that the metallic layers 15 are exposed (S14). By eliminating the metallic layers 13 exposed from the base layer 11, the ends 13b of the metallic layers 13 match the ends 11b of the base layer 11.

The metallic layers 13 are eliminated using wet etching, since they are made of TiW. Thus, the conductive films 15 are exposed. No oxide film is formed on Au; therefore, even if the conductive films 15 are left exposed until the electronic element is mounted, connection reliability at the time of mounting can be ensured.

In this way, the through electrodes 5 passing through the semiconductor substrate 10 and the bump electrodes 5A protruding from the back surface 10B of the semiconductor substrate 10 are formed. Simultaneously, the front surface and back surface of the semiconductor substrate 10 are electrically connected to each other by the through electrodes 5.

Figure 6O:
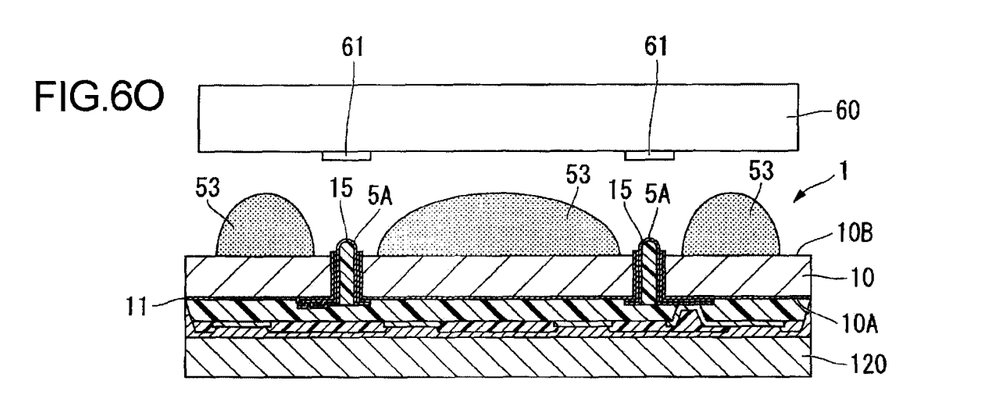
FIGS. 6O to 6Q are sectional views showing steps of the method for manufacturing the semiconductor device according to the first embodiment.
Figure 6P:
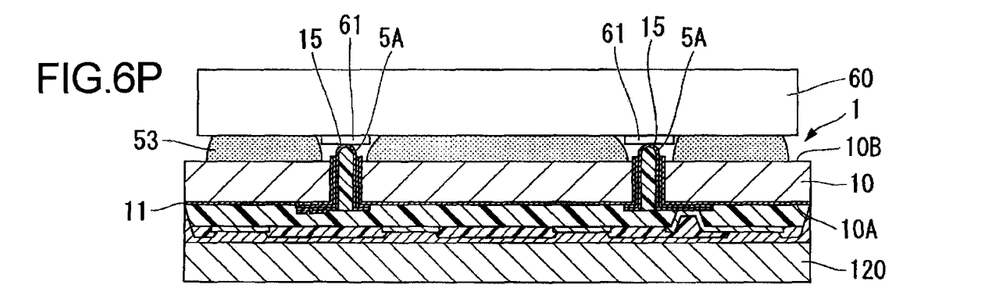
Figure 6Q:
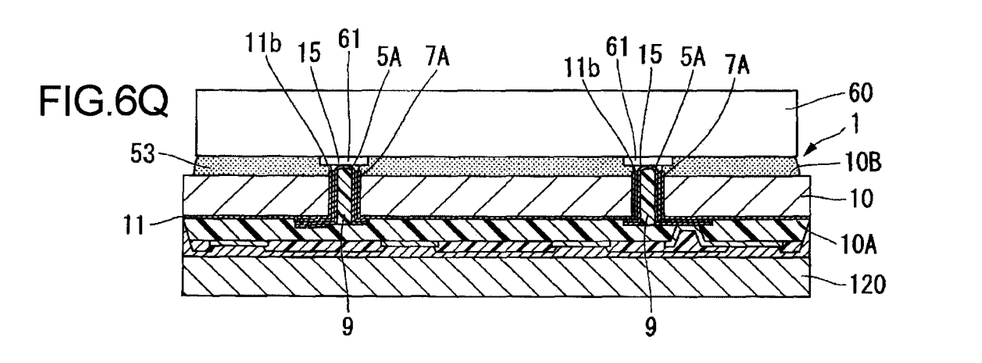

Next, as shown in FIGS. 6O to 6Q, the process of laminating, on the semiconductor device 1, the electronic element 60 having terminals arranged on the surface thereof opposed to the semiconductor device 1 in the same way that the bump electrodes 5A are arranged will be described.

In order to laminate the electronic element 60 on the semiconductor device 1, first, for example, thermosetting resins 53 are disposed on the upper surface (back surface 10B) of the semiconductor device 1 (S15) and, for example, are heated so that the resins are semi-cured. Subsequently, the electrode bumps of the semiconductor device 1 and the electrode terminals 61 formed on the electronic element 60 to be laminated are positioned with respect to each other so that the electrode bumps and terminals 61 overlap each other in a plan view. Thus, the electronic element 60 is laminated on the semiconductor device 1 with the resins 53 interposed therebetween.

Next, as shown in FIG. 6P, heat and pressure are applied in the directions in which the semiconductor device 1 and electronic element 60 are bonded together in a state where the bump electrodes 5A of the semiconductor device 1 and the electrode terminals 61 of the electronic element 60 are opposed to each other (S16). Thus, the conductive films 15 of the bump electrodes 5A are brought into electrical contact with the electrode terminals 61 while the resins 53 are crushed.

Subsequently, when higher pressure is applied (S17), the bump electrodes 5A are crimped onto the electrode terminals 61 so that the bump electrodes 5A become deformed and the contact area of each bump electrode 5A with the corresponding electrode terminal 61 is increased, as shown in FIG. 6Q. As a result, the bump electrodes 5A and electrode terminals 61 are reliably electrically connected to each other. At that time, the bump electrodes 5A easily become deformed, since the tips thereof take the shape of a hemisphere. The ends 11b of the base layer 11 protruding from the openings 7A on the back surface, of the through holes 7 avoid, for example, the deformed bump electrodes 5A from becoming shorted to the semiconductor substrate 10.

Since the load imposed by pressing the electronic element 60 is absorbed by the deformation of the bump electrodes 5A, breakage of the semiconductor device 1 when laminating the electronic element 60 is prevented.

After laminating the electronic element 60, the semiconductor substrate 10 and electronic element 60 are left alone until the softened resins 53 are cured (S18). At that time, the resins may be actively cooled down and thus cured. By curing the resins 53, the bonding among the semiconductor devices 1 is maintained. Also, a photosetting resin may be used as the material of the resins 53. In this case, by applying light to the photosetting resin, the bonding function thereof is exhibited.

Figure 7:
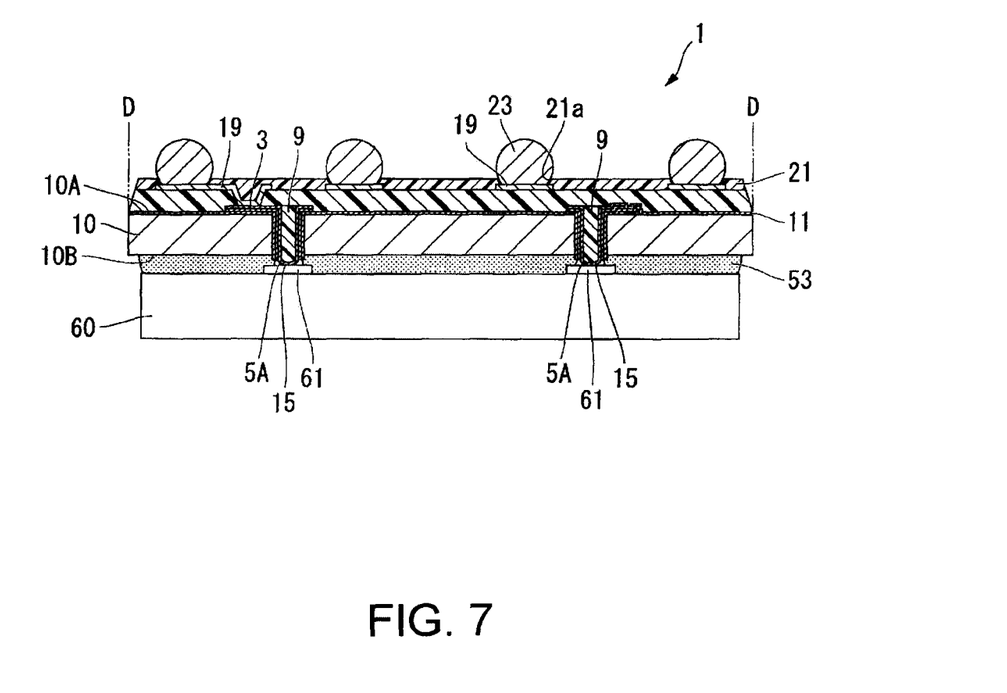
FIG. 7 is a sectional view showing a step of the method for manufacturing the semiconductor device according to the first embodiment.

Next, as shown in FIG. 7, the supporting member 120 supporting the semiconductor substrate 10 is peeled off and then solder balls 23 made of, for example, lead-free solder are formed on the openings 21a provided on the second interlayer insulating layer 21 (S19). Instead of providing the solder balls 23, solder paste may be printed on the re-disposition wiring lines 19 exposed from the openings 21a.

Subsequently, the silicon wafer 100 is cut along the dicing lines D so that individual semiconductor devices 1 are obtained (S20).

In this way, the semiconductor devices 1 are manufactured.

By adopting the semiconductor device 1 according to this embodiment, the bump electrodes 5A become compressed and deformed when relatively pressurizing the electronic element 60 toward the semiconductor device 1 in order to mount the electronic element 60. Thus, the contact area of each bump electrode 5A with the corresponding electrode terminal 61 is increased so that the connection strength is ensured. Thus, the connection reliability at the time of bonding is increased.

Also, when the resin cores 9 become deformed elastically, elasticity restoring forces (repulsion) act on the electrode terminals 61. Thus, the bonding strength between the bump electrodes 5A and electrode terminals 61 is increased. As a result, the reliability of the electrical connection state is increased.

Also, by adopting the manufacturing process according to this embodiment, the step of forming the bump electrodes 5A and the step of connecting the front and back surfaces electrically are combined. This can reduce the manufacturing time. Also, the reduction in the number of steps can reduce the cost significantly.

Also, the bonding structure according to this embodiment allows avoidance of a short between overflow solder and semiconductor substrate 10 (silicon substrate) or a short between the terminals, which has been a problem with respect to bonding using a low-melting-point metal, such as solder. Thus, a semiconductor device having high connection reliability is obtained. Also, since the bonding structure according to this embodiment allows mounting of an electronic element having terminals arranged thereon at a narrow pitch, a device as a whole can be further downsized.

The metallic layers 13 are intended to ensure the adhesion between the base layer 11 and conductive films 15. If the conductive films 15 are made of a material having good adhesiveness to the base layer 11, the metallic layers 13 do not necessarily need to be provided.

In the first embodiment, the tip of each bump electrode 5A is curved in the form of a hemisphere; however, the tip may be flat.

In a case where multiple semiconductor chips are laminated as the electronic elements 60 on the semiconductor device 1, by laminating a semiconductor chip having terminals arranged thereon in the same way as a semiconductor chip below the semiconductor chip, on the latter semiconductor chip one after another, the terminals of each semiconductor chip and those of the immediately upper semiconductor chip are favorably connected to each other.

Second Embodiment

Figure 8A:
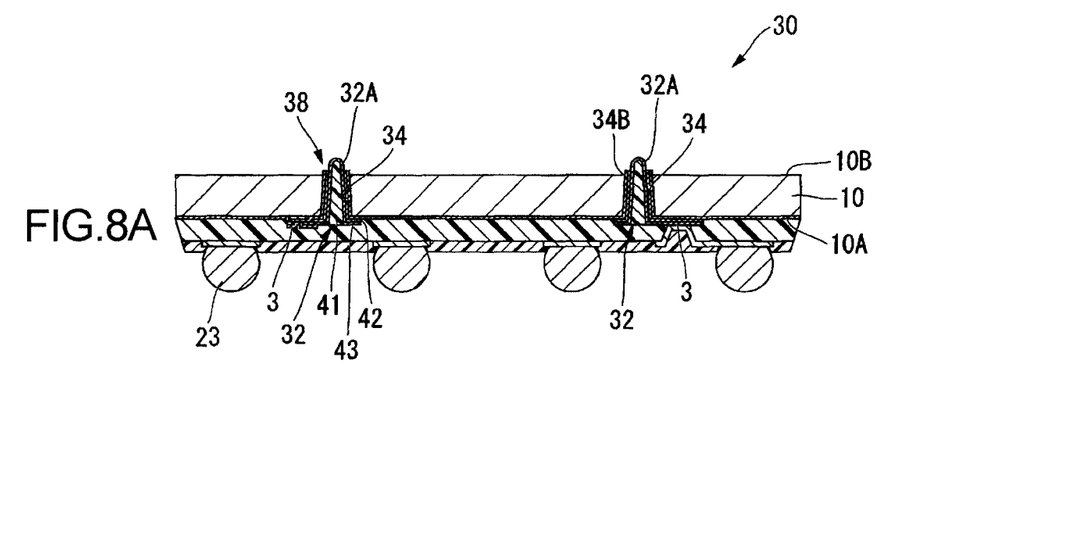
FIGS. 8A and 8B are drawings showing a schematic configuration of a semiconductor device according to a second embodiment of the invention.
Figure 8B:
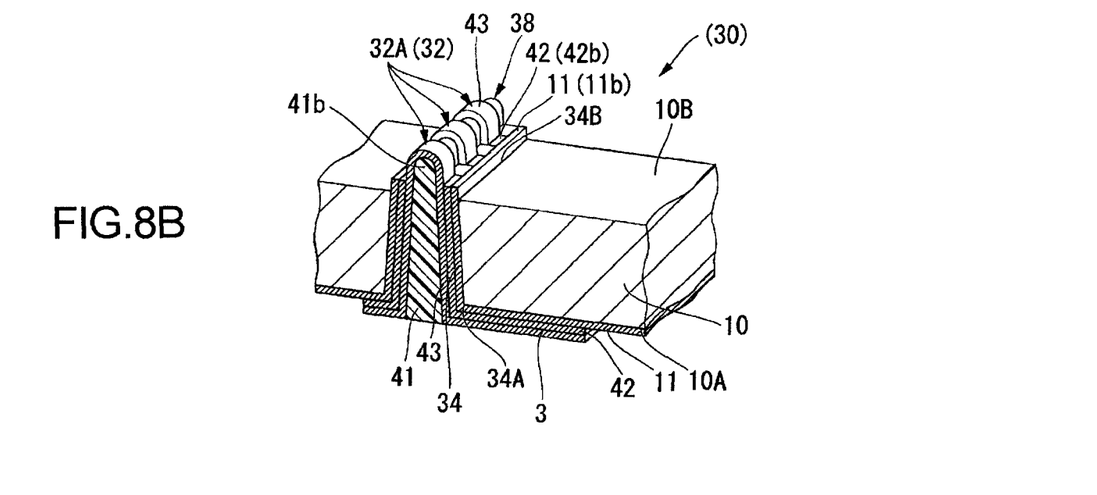

Next, a second embodiment of the invention will be described. FIG. 8A is a sectional view showing a schematic configuration of a semiconductor device 30 according to the second embodiment. FIG. 8B is an enlarged perspective view showing a connecting portion 38 of the semiconductor device 30 according to the second embodiment. The semiconductor device 30 according to this embodiment to be shown below is approximately the same as the above-mentioned first embodiment except for the configuration of through electrodes 32 (bump electrodes 32A) and the manufacturing method thereof. Accordingly, the through electrodes 32 (bump electrodes 32A) and the manufacturing method thereof will be described in detail and the common elements will not be described. Also, same elements as those in FIGS. 1 to 7 will be assigned same reference numerals in the drawings used for description.

As shown in FIGS. 8A and 8B, the semiconductor device 30 according to this embodiment includes the connecting portions 38 that each include the multiple through electrodes 32 provided in one through hole 34 made on the semiconductor substrate 10.

The multiple through electrodes 32 each include a resin core 41 extending inside the through hole 34, which is long in one direction in a plan view, along the extending direction of the through hole 34 and a stripe-shaped conductive film 43 that partially covers the surface of the resin core 41 (including the surface of the end thereof protruding from an opening 34B). The conductive films 43 are disposed at equal intervals in the length direction of the through hole 34. Thus, the front and back surfaces of the semiconductor substrate 10 are electrically connected to each other.

The ends protruding from the back surface 10B, of the through electrodes 32 serve as the bump electrodes 32A according to this embodiment.

In the connecting portion 38 as described above, the surface of each resin core 41 between the conductive films 43 is partially exposed.

The through hole 34 takes a rectangular shape in a plan view and takes a tapered shape, which is tapered down toward the back surface 10B in the substrate thickness direction, in a cross section. The taper angle is set as appropriate and is not limited to that shown in FIGS. 8A and 8B.

Disposed in the through hole 34 are the base layer 11, multiple metallic layers 42 and multiple conductive films 43, and resin cores 41 that fill the gap in the through hole 34. The surface of an end 41b of each resin core 41 is partially covered by the corresponding stripe-shaped conductive film 43.

The base layer 11 is formed in such a manner that it covers the active surface 10A of the semiconductor substrate 10 and the entire inner surface of the through hole 34 and in such a manner that the ends 11b protruding from the back surface 10B cover the base portion of the connecting portion 38 (bump electrodes 32A).

Each metallic layer 42 and the corresponding conductive film 43 are formed with approximately the same width and are partially laminated in the length direction thereof. An end 42b of each metallic layer 42 protrudes from an opening 34B on the back surface 10B, of the through hole 34 and extends to the position of the end 11b of the base layer 11. In this embodiment, each metallic layer 42 is provided in the area where the corresponding conductive film 43 and base layer 11 are stacked. Thus, the adhesiveness of each conductive film 43 to the base layer 11 is ensured.

Also, each metallic layer 42, which is drawn from an opening 34A on the active surface 10A, of the through hole 34, is formed with a size including at least the area of the active surface 10A on which the electrode pad 3 is to be formed and as partially covering the base layer 11 near the opening 34A. Since the electrode pads 3 are formed on the metallic layers 42, the adhesion between the electrode pads 3 and base layer 11 is ensured.

The multiple electrode pads 3 are provided along the length direction of the through hole 34 and bonded (electrically connected) to the conductive films 43.

For the bump electrodes 32A having the above-mentioned configuration, the portion covered by the conductive film 43, of the end 41b of the resin core 41 becomes an area to be connected to the terminal 61 of the electronic element 60 to be described later. A part of the conductive film 43 in this area substantially functions as an electrode. That is, the exposed portion of each conductive film 43 and the resin core 41 located inside the exposed portion function as an independent bump electrode 32.

Next, a method for manufacturing the semiconductor device 30 according to the second embodiment will be described with reference to FIGS. 8A and 8B. The process of mounting an electronic element will be described with reference to FIGS. 9A and 9B. While FIGS. 3A to 7 will be referred to with respect to the same steps as those in the above-mentioned first embodiment, the description of such steps will be partially omitted.

Vias that each shrink in the substrate thickness direction from the active surface 10A of the semiconductor substrate 10 toward the back surface 10B thereof and are tapered in a sectional view are formed. The width of the bottom of each via is set to 50 μm and the length in the surface direction of the substrate, of each via is set to 200 μm. The vias are formed using dry etching so that each via takes a rectangular shape in a plan view. In this case, adjustment is made so that the bottom of each via is curved.

Next, the base layer 11 made of $SiO_2$, a TiW-sputtered film, and an Au-sputtered film are formed as covering the active surface 10A of the semiconductor substrate 10 and the inner surfaces of the vias.

Subsequently, by patterning the TiW film and Au film simultaneously, the multiple stripe-shaped conductive films 43 are formed as extending in the width direction of the through hole and as arranged at equal intervals in the length direction thereof, and the electrode pads 3 are formed as bonded to the conductive films 43. At that time, by patterning the TiW film simultaneously, each metallic layer 42 is formed below the electrode pad 3 and conductive film 43 in such a manner that the TiW film is partially left in the area where the electrode pad 3 and conductive film 43 are stacked.

In this embodiment, a photosensitive resist is applied to the Au film using spray coating and then exposed and developed. Subsequently, wet etching is performed on the Au film and TiW film using the resist as a mask. Thus, the metallic layers 42 and conductive films 43 are patterned into stripes (wiring lines), and the electrode pads 3 are patterned into predetermined shapes. The pitch between the multiple multilayer bodies each including the conductive film 43 and metallic layer 42 is set to 20 μm.

The metallic layers 42 and conductive films 43 may be formed by etching the Au film and TiW film using photolithography or may be directly formed by discharging a conductive liquid onto the active surface 10A using inkjet Next, the through holes 34 become filled with a resin so that the resin cores 41 are formed. Subsequently, the semiconductor substrate 10 is thinned down from the back surface 10B so that the vias pass through the semiconductor substrate 10 and the base layer 11 is exposed. Subsequently, the exposed base layer 11 is eliminated so that the multiple metallic layers 42 and parts of the resin cores 41 between the metallic layers 42 are exposed. Dry etching or wet etching is used to eliminate the base layer 11. The base layer 11 is eliminated in such a manner that the ends 11b of the base layer 11 protrude from the opening 34B on the back surface 10B, of each through hole 34 with a predetermined amount.

Next, the exposed metallic layers 42 are eliminated using wet etching so that the conductive films 43 below the metallic layers 42 are exposed. At that time, the resin cores 41 exposed between the metallic layers 42 are slightly eliminated. If the surface of any resin core 41 protrudes from the surface of the corresponding to conductive film 43, the resin core 41 is partially etched. It is preferable at least that the surface of each resin core 41 not protrude higher than the surface of the corresponding to conductive film 43. It is more preferable that the surface of each conductive films 43 protrude higher than the surface of the corresponding resin core 41. Thus, the bump electrodes 32A are favorably connected to the electrode terminals 61 of the electronic element 60.

In this way, the multiple through electrodes 32 are formed in each of the through holes 34 passing through the semiconductor substrate 10 in the thickness direction thereof and, simultaneously, the multiple bump electrodes 32A protruding from the back surface 10B of the semiconductor substrate 10 are formed. Thus, the connecting portions 38 to be connected to the electronic element 60 are formed on the back surface 10B of the semiconductor substrate 10.

The subsequent steps of forming the first inter-layer insulating layer 17, re-disposition wiring line 19, second inter-layer insulating layer 21, solder ball 23, and the like and the subsequent dicing step are the same as those in the above-mentioned embodiment (see FIGS. 3G to 7) and will not be described.

Figure 9A:
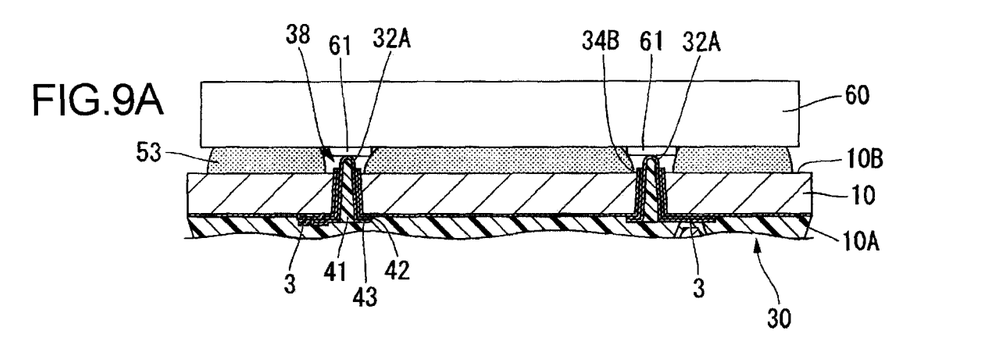
FIGS. 9A and 9B are drawings showing steps of a method for manufacturing the semiconductor device according to the second embodiment.
Figure 9B:
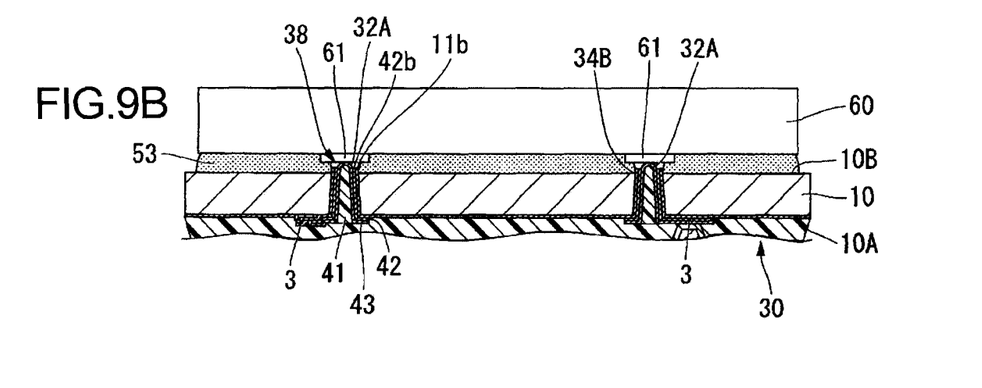

Next, as shown in FIG. 9A, the electronic elements 60 are laminated on the obtained individual semiconductor devices 30 according to this embodiment. Each semiconductor device 30 and the corresponding electronic element 60 are positioned with respect to each other in such a manner that the bump electrodes 32A and electrode terminals 61 are opposed to each other, and are then subjected to application of heat and pressure in such a manner that the resins 53 for bonding are interposed therebetween. Subsequently, as shown in FIG. 9B, the conductive films 43 of the bump electrodes 32A are brought into electrical contact with the electrode terminals 61. By further applying pressure, the connecting portions 38 are pressed by the electronic element 60 and thus compressed and deformed. When the bump electrodes 32A become deformed, the contact area of each bump electrode 32A with the corresponding electrode terminal 61 is increased. Thus, the bump electrodes 32A and electrode terminals 61 are reliably electrically connected to each other. At that time, the base layer 11 protruding the openings 34B on the back surface, of the through holes 34 avoids the deformed bump electrodes 32A from becoming shorted to the semiconductor substrate 10.

Also, portions that are not covered by the conductive films 43, that is, are exposed, of the resin cores 41 are directly bonded to the electronic element 60. In this case, if a heat-adhesive, insulating material that is identical to the material of the resins 53 for bonding the semiconductor device 30 and electronic element 60 together and exhibits adhesiveness when heated is adopted as the material of the resin cores 41, it is possible to provide, to the resin cores 41, a function of adhering to the electronic element 60. Due to the adhesion of both the resins 53 and resin cores 41 to the electronic element 60, the electrical contact of the bump electrodes 32A with the electrode terminals 61 is maintained.

In this way, the electronic elements 60 are mounted on the semiconductor devices 30.

By adopting this embodiment, the multiple bump electrodes 32A are disposed and formed inside one through hole 34 (opening 34B). Thus, the pitch can be further narrowed to approximately 20 μm or less. For this reason, it is expected that the device will be significantly downsized. Also, since the bonding strength is ensured due to the adhesion to the resin cores 41 to the electronic element 60, a reliable semiconductor device 30 can be obtained.

Also, in this embodiment, the bump electrodes 32A are tapered, so the contact area of each bump electrode 32A with the corresponding electrode terminal 61 of the electronic element 60 is increased. Thus, the connection reliability is further increased.

While the exemplary embodiments of the invention have heretofore been described with reference to the accompanying drawings, the invention is not limited thereto and the above-mentioned embodiments may be combined. Obviously, those skilled in the art can conceive various changes and modifications to the embodiments without departing from the technical ideal described in the appended claims. Therefore, it should be understood that such changes and modifications also fall with the technical scope of the invention.

While a case where the semiconductor devices 1 or 30 are simultaneously and collectively formed on the silicon wafer 100 has been described in the above-mentioned embodiments, the semiconductor device 1 or 30 may be formed on the semiconductor substrate 10 on a one-by-one basis.

Also, in the above-mentioned embodiments, the multiple electronic elements 60 having terminals arranged thereon in the same way, such as memory ICs, are laminated on the semiconductor device 1 or 30; however, semiconductor chips or electronic elements having terminals arranged thereon in different ways may be laminated.

As the electronic element, a surface acoustic wave element, a quartz crystal resonator, a piezoelectric resonator, a piezoelectric tuning fork, or the like may be connected to the semiconductor device 1 or 30.

Electronic Apparatus

Figure 10:
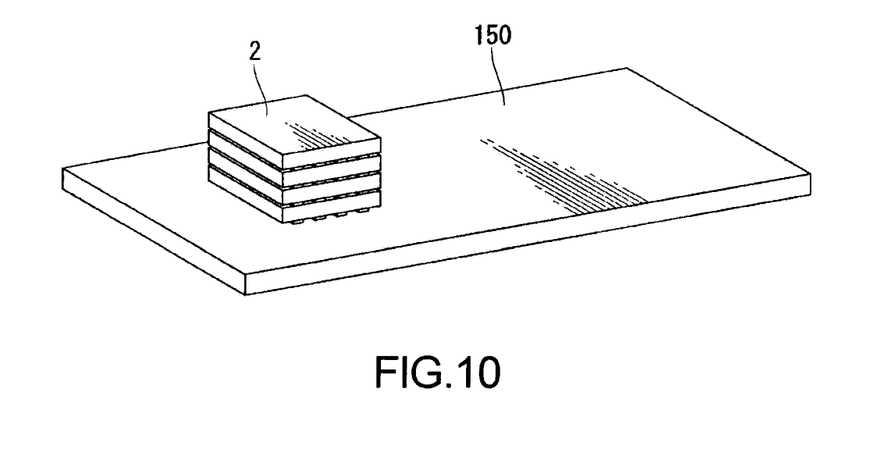
FIG. 10 is a perspective view showing a circuit substrate, which is an example of an electronic apparatus.

Next, a circuit substrate 150 (electronic apparatus) including the semiconductor device 1 according to the invention will be described. FIG. 10 is a perspective view showing a schematic configuration of a circuit substrate according to an embodiment of the invention. As shown in FIG. 10, a multilayer body 2 where semiconductor chips or the like are laminated on the semiconductor device 1 is mounted on the circuit substrate 150 according to this embodiment. The circuit substrate 150 is an organic substrate, such as a glass epoxy substrate, and is formed in such a manner that wiring patterns (not shown) made of copper or the like serve as a desired circuit. Electrode pads (not shown) are provided on these wiring patterns.

The multilayer body 2 is mounted on the circuit substrate 150 in such a manner that the solder balls 23 of the semiconductor device 1 are electrically connected to the electrode pads.

By adopting the circuit substrate 150 according to the invention, the multilayer body 2 including the semiconductor device 1 not requiring an interposer substrate can be mounted on the circuit substrate 150.

Also, since a break in the re-disposition wiring lines is prevented and the semiconductor device 1 is downsized and thinned, the circuit substrate 150 provided with the multilayer body 2 including the semiconductor device 1 is also downsized, and the reliability thereof is high.

Figure 11:
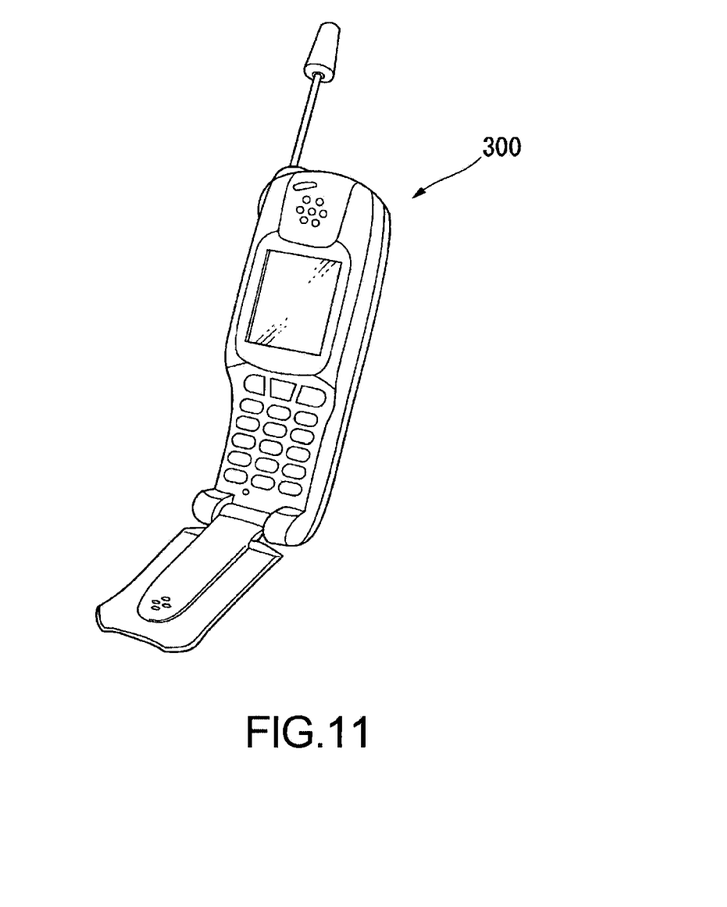
FIG. 11 is a perspective view showing a cell phone, which is an example of an electronic apparatus.

Next, an electronic apparatus including the circuit substrate 150 according to the invention will be described. FIG. 11 shows a cell phone 300 serving as an electronic apparatus according to an embodiment of the invention. The cell phone 300 includes the circuit substrate 150.

Since the cell phone 300 according to the invention includes the above-mentioned small, highly reliable circuit substrate 150, the cell phone 300 is also small and highly reliable.

The electronic apparatus according to the invention is not limited to the cell phone 300 and is applicable to various electronic apparatuses. The electronic apparatus according to the invention is applicable to electronic apparatuses, such as a liquid crystal projector, a personal computer (PC) corresponding to multi-media, an engineering workstation (EWS), a pager, a word processor, a television set, a view finder-type or monitor direct view-type video tape recorder, an electronic notepad, an electronic desk calculator, a car navigation system, a POS terminal, and an apparatus equipped with a touch panel.

What is claimed is:
1. A semiconductor device, comprising:
a semiconductor substrate having a first surface and a second surface opposite to each other;
a through hole provided in the semiconductor substrate;
an insulation film provided along an inner surface of the through hole;
a metal layer provided along an inner surface of the insulating film in the through hole, a metal layer tip of the metal layer protruding relative to the second surface of the semiconductor substrate;

a through electrode provided along an inner surface of the metal layer in the through hole, a through electrode tip of the through electrode protruding relative to the second surface of the semiconductor substrate;
a resin provided along an inner surface of the through electrode in the through hole, the resin being located inside the through electrode, a resin tip of the resin protruding relative to the second surface, wherein
the through electrode tip is a bump electrode,
the insulation film and the metal layer are provided between the inner surface of the through hole and the through electrode, and
the metal layer tip terminates at a location between the through electrode tip of the through electrode and the second surface of the semiconductor substrate.

2. The semiconductor device according to claim 1, wherein the through electrode tip has a curved surface.

3. The semiconductor device according to claim 1, wherein the through electrode is elastically deformable together with the resin.

4. The semiconductor device according to claim 1, wherein the through electrode has a tapered shape, the tapered shape being tapered toward the through electrode tip of the through electrode.

5. The semiconductor device according to claim 1, wherein the through electrode includes at least one ductile metallic film.

6. The semiconductor device according to claim 1, wherein the insulation film protrudes relative to the second surface of the semiconductor substrate.

7. An electronic apparatus, comprising:
the semiconductor device according to claim 1;
an electronic element facing the semiconductor substrate, the electronic element including a pad formed on the electronic element; and
a thermosetting resin provided between the semiconductor device and the electronic element, the thermosetting resin being located outside of the bump electrode and the pad, wherein
the electronic element is mounted on the semiconductor device by a connection between the bump electrode and the pad and a deformation of the bump electrode and the thermosetting resin.

8. A semiconductor device, comprising:
a semiconductor substrate having a first surface and a second surface opposite to each other;
a through hole provided in the semiconductor substrate;
a resin member provided in the through hole and having a part protruding relative to the second surface;
a through electrode provided in the through hole between the resin member and an inner surface of the through hole, a tip of the through electrode protruding relative to the second surface and overlaying the protruding part of the resin member to form a bump electrode;
an insulation film covers the inner surface of the through hole; and
a metal layer provided in the through hole between the insulation film and the through electrode, a tip of the metal layer protruding relative to the second surface and terminating at a location between the through electrode tip of the through electrode and the second surface of the semiconductor substrate.

9. The semiconductor device according to claim 8, wherein the tip of the through electrode has a curved surface.

10. The semiconductor device according to claim 8, wherein
the through electrode is elastically deformable together with the resin member.

11. The semiconductor device according to claim 8, wherein
the through electrode has a tapered shape, the tapered shape being tapered toward the tip of the through electrode.

12. The semiconductor device according to claim 8, wherein
the through electrode includes at least one ductile metallic film.

13. The semiconductor device according to claim 8, wherein
the insulating film provided in the through hole between the metal layer and an entirety of the inner surface of the through hole, the insulation film protruding relative to the second surface.

14. An electronic apparatus, comprising:
the semiconductor device according to claim 8;
an electronic element facing the semiconductor substrate, the electronic element including a pad formed on the electronic element; and
a thermosetting resin provided between the semiconductor device and the electronic element, the thermosetting resin being located outside of the bump electrode and the pad, wherein
the electronic element is mounted on the semiconductor device by a connection between the bump electrode and the pad and a deformation of the bump electrode and the thermosetting resin.

* * * * *